United States Patent
Nomura et al.

(10) Patent No.: US 8,358,985 B2
(45) Date of Patent: *Jan. 22, 2013

(54) RADIO WAVE RECEIVING APPARATUS

(75) Inventors: Keiichi Nomura, Uenohara (JP); Kaoru Someya, Kiyose (JP)

(73) Assignee: Casio Computer Co., Ltd., Tokyo (JP)

( * ) Notice: Subject to any disclaimer, the term of this patent is extended or adjusted under 35 U.S.C. 154(b) by 454 days.

This patent is subject to a terminal disclaimer.

(21) Appl. No.: 12/652,850

(22) Filed: Jan. 6, 2010

(65) Prior Publication Data

US 2010/0178888 A1 Jul. 15, 2010

(30) Foreign Application Priority Data

Jan. 14, 2009 (JP) .................................. 2009-005683

(51) Int. Cl.
- H04B 1/18 (2006.01)
- H04B 1/26 (2006.01)
- H04B 1/06 (2006.01)
- H04B 7/00 (2006.01)

(52) U.S. Cl. ............... 455/150.1; 455/192.1; 455/196.1; 455/250.1

(58) Field of Classification Search .................. 455/136, 455/138, 140, 196.1–199.1, 226.1–226.2, 455/232.1–234.2, 249.1–251.1, 150.1, 192.1–193.1
See application file for complete search history.

(56) References Cited

U.S. PATENT DOCUMENTS

| 4,100,578 A | 7/1978 | Arneson |
| 4,326,220 A | 4/1982 | Mogi |
| 4,864,639 A * | 9/1989 | Dapore et al. ............. 455/226.4 |

(Continued)

FOREIGN PATENT DOCUMENTS

| AU | 2008 101062 A4 | 11/2008 |
| DE | 10 2004 037637 A1 | 3/2006 |

(Continued)

OTHER PUBLICATIONS

U.S. Appl. No. 12/774,099; First Named Inventor: Kaoru Someya; Title: "Radio Wave Receiver"; filed May 5, 2010.

(Continued)

*Primary Examiner* — Simon Nguyen
(74) *Attorney, Agent, or Firm* — Holtz, Holtz, Goodman & Chick, PC

(57) ABSTRACT

A radio wave receiving apparatus is provided with a tuning circuit for bringing a receiving frequency of an antenna tuned in to a frequency of a desired wave, a frequency converting circuit for mixing a local oscillation signal with the signal received through the antenna, thereby converting the received signal into an intermediate frequency signal, a feed back loop including at least a portion of the tuning circuit for feeding back the received signal, a controller for detecting a level of the intermediate frequency signal to change a frequency characteristic of the tuning circuit, thereby obtaining a tuning point corresponding to the desired wave, wherein, the controller brings the feed back loop in operation, thereby changing the frequency characteristic of the tuning circuit, and when two peaks of a level of the received signal are detected while the frequency characteristic of the tuning circuit is changed, the controller selects as a tuning point corresponding to the desired wave a tuning point at which one of the two peaks of the level of the received signal corresponding to a high-low relationship between the predetermined frequency of the local oscillation signal and the frequency of the desired wave is detected.

4 Claims, 5 Drawing Sheets

U.S. PATENT DOCUMENTS

| | | | |
|---|---|---|---|
| 5,239,701 A * | 8/1993 | Ishii | 455/180.1 |
| 5,280,643 A * | 1/1994 | Ishii | 455/254 |
| 5,398,035 A | 3/1995 | Densmore et al. | |
| 5,521,651 A | 5/1996 | Matsui | |
| 5,722,060 A | 2/1998 | Horigome | |
| 6,177,846 B1 | 1/2001 | Takada et al. | |
| RE37,218 E | 6/2001 | Densmore et al. | |
| 6,389,272 B1 | 5/2002 | Horigome et al. | |
| 6,535,075 B2 | 3/2003 | Frech et al. | |
| 6,625,433 B1 * | 9/2003 | Poirier et al. | 455/232.1 |
| 6,681,102 B1 | 1/2004 | Collier et al. | |
| 6,750,734 B2 | 6/2004 | Utsunomiya et al. | |
| 7,155,186 B2 | 12/2006 | Kasperkovitz | |
| 7,187,913 B1 | 3/2007 | Rahn et al. | |
| 7,227,916 B2 * | 6/2007 | Ruelke et al. | 375/345 |
| 7,245,890 B2 * | 7/2007 | Kumagawa et al. | 455/130 |
| 7,251,466 B2 | 7/2007 | Porret et al. | |
| 7,299,018 B2 | 11/2007 | Van Rumpt | |
| 7,583,942 B2 | 9/2009 | Ihara | |
| 7,756,500 B1 | 7/2010 | Fulga et al. | |
| 7,860,477 B2 | 12/2010 | Christ | |
| 7,991,371 B2 * | 8/2011 | Ishiguro | 455/234.1 |
| 8,131,237 B2 | 3/2012 | Someya | |
| 2004/0137865 A1 | 7/2004 | Callias et al. | |
| 2006/0217094 A1* | 9/2006 | Ikeda et al. | 455/136 |
| 2007/0285255 A1 | 12/2007 | Tsushima et al. | |
| 2007/0296593 A1 | 12/2007 | Hall et al. | |
| 2008/0081583 A1* | 4/2008 | Zhang et al. | 455/193.1 |
| 2009/0176467 A1* | 7/2009 | Im et al. | 455/182.1 |
| 2010/0149430 A1 | 6/2010 | Fulga et al. | |
| 2010/0149431 A1 | 6/2010 | Fulga et al. | |
| 2010/0304698 A1 | 12/2010 | Someya | |
| 2012/0129477 A1 | 5/2012 | Someya | |

FOREIGN PATENT DOCUMENTS

| | | |
|---|---|---|
| EP | 1 865 445 A2 | 12/2007 |
| JP | 63-217830 A | 9/1988 |
| JP | 11-312959 A | 11/1999 |
| JP | 2000-231609 A | 8/2000 |
| JP | 2002-365384 A | 12/2002 |
| JP | 2003-332934 A | 11/2003 |
| JP | 2004-505485 A | 2/2004 |
| JP | 2006-246419 A | 9/2006 |
| JP | 2007-096381 A | 4/2007 |
| WO | WO 2004/105240 A1 | 12/2004 |

OTHER PUBLICATIONS

U.S. Appl. No. 12/486,212; First Named Inventor: Kaoru Someya; Title: "Radio Wave Receiving Apparatus"; Filed: Jun. 17, 2009.

U.S. Appl. No. 13/359,853; First Named Inventor: Kaoru Someya; Title: "Radio Wave Receiving Apparatus"; Filed: Jan. 27, 2012.

* cited by examiner

FIG. 2

| RECEIVING CHANNEL | CHANNEL SETTING INFORMATION | |
|---|---|---|
| | LOCAL OSCILLATION FREQUENCY | FREQUENCY HIGH-LOW INFORMATION |
| A | 41KHZ | UPPER LOCAL |
| B | 61KHZ | UPPER LOCAL |
| C | 76.5KHZ | LOWER LOCAL |

FIG. 3

| FREQUENCY RELATIONSHIP BETWEEN DESIRED WAVE AND LOCAL OSCILLATION SIGNAL | FREQUENCY RELATIONSHIP BETWEEN DESIRED WAVE AND IMAGE FREQUENCY |
|---|---|
| DESIRED WAVE < LOCAL OSCILLATION SIGNAL (UPPER LOCAL) | DESIRED WAVE < IMAGE FREQUENCY |
| DESIRED WAVE > LOCAL OSCILLATION SIGNAL (LOWER LOCAL) | DESIRED WAVE > IMAGE FREQUENCY |

RADIO WAVE RECEIVING APPARATUS

CROSS-REFERENCE TO RELATED APPLICATIONS

This application is based upon and claims the benefit of priority from prior Japanese Patent Application No. 2009-005683, filed Jan. 14, 2009, the entire contents of which are incorporated herein by reference.

BACKGROUND OF THE INVENTION

The present invention relates to a radio wave receiving apparatus, which is provided with an antenna and a tuning circuit.

A communication apparatus is disclosed by Japanese Patent No. 2000-231609 A and Japanese Patent No. Hei 11-312959 A, which apparatus has an antenna and a tuning circuit connected to the antenna, and automatically adjusts a frequency characteristic of the tuning circuit to bring a receiving frequency of the antenna tuned in to a frequency of a desired wave. The communication apparatus is required to perform a tuning process to adjust the tuning circuit while receiving a transmitted radio wave, or it is necessary to use a separate oscillator, which generates a signal having same frequency as the actual radio wave, for performing the tuning process to adjust the tuning circuit of the communication apparatus. In the tuning process, a user changes capacitance of the tuning circuit to obtain a detected signal of the maximum level, or adjusts the tuning circuit to obtain AGC signal of the maximum gain, while monitoring AGC signal and/or a signal level of the detected signal obtained in the receiving process.

Meanwhile, a receiving circuit of the super heterodyne system has a problem that an image frequency can prevent it from obtaining the correct tuning point, if no modification is made.

An object of the present invention is to provide a radio wave receiving apparatus, which can obtain a correct tuning point of a tuning circuit that meets with a frequency of a desired wave, even if the tuning circuit is of the super heterodyne system.

SUMMARY OF THE INVENTION

According to one aspect of the present invention, there is provided a radio wave receiving apparatus, which comprises an antenna for receiving a radio wave, a tuning unit for bringing a receiving frequency of the antenna tuned in to a frequency of a desired wave to receive a signal through the antenna, a local oscillator for generating a local oscillation signal of a predetermined frequency, a frequency converting unit for mixing the local oscillation signal generated by the local oscillator with the signal received through the antenna, thereby converting the received signal into an intermediate frequency signal, a feed back unit forming an oscillation loop with a signal pass including at least a portion of the tuning unit for feeding back the received signal but not yet converted into the intermediate frequency signal, a switching unit for bringing the feed back unit in operation and/or out of operation, a control unit for detecting a level of the intermediate frequency signal converted by the frequency converting unit to change a frequency characteristic of the tuning unit, thereby obtaining a tuning point corresponding to the desired wave, wherein the control unit makes the switching unit bring the feed back unit in operation, thereby changing the frequency characteristic of the tuning unit, and when two peaks of a level of the received signal are detected while the frequency characteristic of the tuning unit is changed, the control unit selects as a tuning point corresponding to the desired wave a tuning point at which one of the two peaks of the level of the received signal is detected, corresponding to a high-low relationship between the predetermined frequency of the local oscillation signal and the frequency of the desired wave.

BRIEF DESCRIPTION OF THE DRAWINGS

FIG. 2 is a data chart showing channel setting information recorded in ROM shown in FIG. 1.

FIG. 3 is a view showing a table for explaining a relationship between frequencies of a desired signal and image frequencies.

DESCRIPTION OF THE PREFERRED EMBODIMENTS

Now, embodiments of the present invention will be described in detail with reference to the accompanying drawings.

Figure 1:
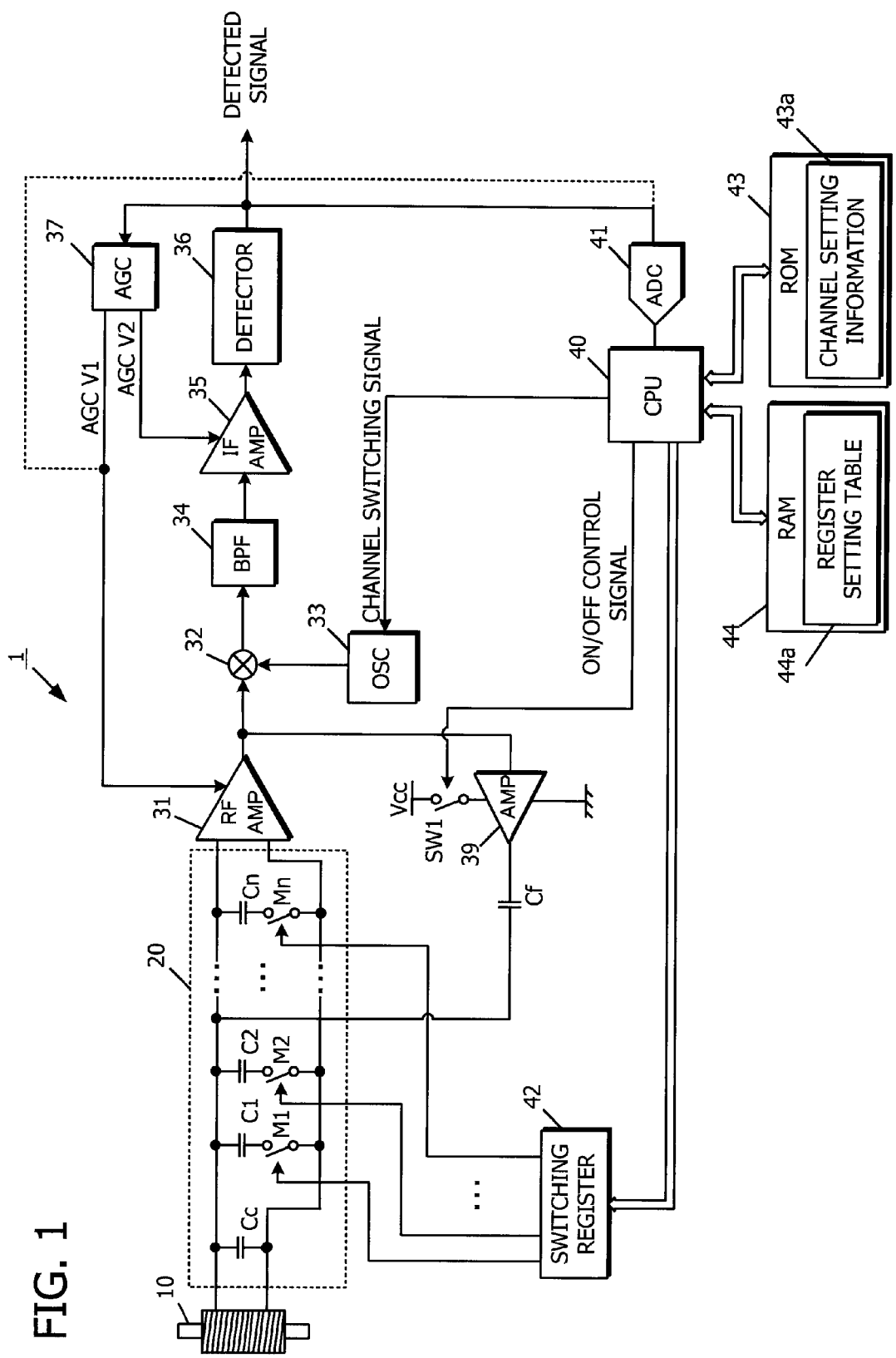
FIG. 1 is a block diagram of a circuit configuration of a radio wave receiving apparatus according to an embodiment of the invention.

FIG. 1 is a block diagram of a circuit configuration of a radio wave receiving apparatus according to the embodiment of the invention. The radio wave receiving apparatus 1 according to the embodiment of the invention is prepared to be built in electronic time pieces such as wrist watches and clocks. The radio wave receiving apparatus 1 serves to receive standard radio waves to detect a time code signal. The available standard radio waves includes plural standard radio waves having carrier frequencies of 40 KHz, 60 KHz and 77.5 KHz.

As shown in FIG. 1, the radio wave receiving apparatus 1 comprises an antenna 10 for receiving a radio wave, a tuning unit serving as a tuning circuit 20 for adjusting a receiving frequency of the antenna 10, a switching register 42 for switching a tuning state of the tuning circuit 20, RF amplifier 31 for amplifying a received signal, a mixer and a local oscillator 33, both for converting the received signal into a signal of an intermediate frequency (intermediate frequency signal), a band pass filter 34 for allowing only the intermediate frequency signal to pass through, IF amplifier 35 for amplifying the intermediate frequency signal, a detector 36 for detecting a signal from the intermediate frequency signal, an automatic gain controlling circuit (AGC) 37 for controlling gain of the RF amplifier 31 and IF amplifier 35 to stabilize a signal level of the detected signal, AD converter 41 for converting the detected signal into a digital signal, CPU 40 for controlling the whole operation of the apparatus 1, ROM (Read Only Memory) 43 serving as a memory for recording control data and a control program, RAM (Random Access Memory) 44 serving as a memory for recording setting data, a non-inverting amplifier 39 and a coupling condenser Cf, both composing a feed back circuit of the tuning circuit 20, and a switch SW1 for switching operation of the non-inverting amplifier 39 from ON to OFF, and vice versa. The antenna 10 is made of a bar antenna of a ferrite core with a wire wound there round.

The tuning circuit 20 comprises tuning capacitors Cc, and C1 to Cn, and plural switches M1 to Mn. The switches M1 to Mn are connected to the capacitors Cc to Cn in series, respectively, to connect or disconnect the capacitors Cc to Cn. The tuning capacitor Cc is connected with the winding of the antenna 10 in parallel, and further other capacitors Cc to Cn are disconnected or connected with the capacitor Cc in parallel depending on connection of the switches M1 to Mn. Since the capacitors C1 to Cn have different capacitances, a tuning capacitor to be connected with the winding of the antenna 10 can be fine-adjusted from a low capacitance to high capacitance depending on combination of ON/OFF connection of the switches M1 to Mn.

The switching register 42 records plural pieces of bit data corresponding to the plural switches M1 to Mn, respectively, and outputs an on-off signal corresponding to the bit data value.

When the switch WS1 is turned on, the power is supplied to the non-inverting amplifier 39 in the feed back circuit. Then, an output of RF amplifier 31 is amplified by the non-inverting amplifier 39 and positively fed back to a signal line of the tuning circuit 20 through the coupling condenser Cf in the feed back circuit. When the switch WS1 is turned off, no power is supplied to the non-inverting amplifier 39, disconnecting the non-inverting amplifier 39 from the RF amplifier 31 and tuning circuit 20. Since the coupling condenser Cf has extremely small capacitance and an input terminal of the non-inverting amplifier 39 is kept at a high impedance, the non-inverting amplifier 39 and the coupling condenser Cf have little influence to the tuning circuit 20 and RF amplifier 31 while the switch SW1 is kept off.

The pass through which the signal is fed back is not restricted to the feed back circuit (the non-inverting amplifier 39 and the coupling condenser Cf) shown in FIG. 1. More specifically, the signal which has not yet been converted to the intermediate frequency signal may be fed back to the signal line included in the tuning circuit 20. For example, a signal to be supplied to RF amplifier 31 may be fed back to the signal line in the tuning circuit 20 through the non-inverting amplifier 39 and the coupling condenser Cf. If a filter is provided between RF amplifier 31 and the mixer 32, a signal output from the filter may be fed back to the signal line in the tuning circuit 20 through the non-inverting amplifier 39 and the coupling condenser Cf. Further, it is not always necessary to feed back the feed back signal to the signal line in the tuning circuit 20, but the feed back signal may be fed back to the winding of the antenna 10 or to a subsidiary winding electromagnetically coupled with the winding of the antenna 10.

The feed back circuit including the non-inverting amplifier 39 and the coupling condenser Cf is shown by way of example in FIG. 1. But using no non-inverting amplifier 39 and coupling condenser Cf, a feed back circuit may be composed of a line connecting an output terminal of RF amplifier 31 with the signal line of the tuning circuit 20 and a switch provided at an intermediate point of the line.

The mixer 32 and the local oscillator 33 cooperate to mix the received signal and an oscillation signal of a certain frequency together, thereby converting the received signal into a signal of an intermediate frequency (intermediate frequency signal). In the present embodiment, a local oscillation frequency of the local oscillator 33 is switched in response to a channel switching signal sent from CPU 40, which allows to convert the received signals of plural channels into a signal having the same intermediate frequency.

In accordance with the control data and control program recorded in ROM 43, CPU 40 controls ON-OFF switching operation of the switch SW1, and writes bit data in the switching register 42 to switch a frequency characteristic of the tuning circuit 20, and further outputs the channel switching signal to the local oscillator 33 to switch the local oscillation frequency of the local oscillator 33. Meanwhile, CPU 40 receives through AD converter 41 a signal detected by the detector 36 in an automatic tuning process to measure a level of the received signal which has been converted into the intermediate frequency signal. It may be possible to arrange such that CPU 40 receives a gain control signal AGC V1 from AGC 37 through AD converter 41 as indicated by a dotted line in the right side of FIG. 1 to measure a level of the received signal.

FIG. 2 is a data chart showing channel setting information recorded in ROM 43. The channel setting information 43a is included as one of various pieces of control data recorded in ROM 43. As shown in FIG. 2, in the channel setting information 43a are included plural pieces of information corresponding to plural receiving channels, respectively, each piece information including a receiving channel information, a local oscillation frequency (local oscillation frequency setting information), and information indicating a high-low relationship between the local oscillation signal and a desired wave (local oscillation frequency high-low information). CPU 40 switches the local oscillation frequency of the local oscillator 33 based on the setting information of the local oscillation frequency, whereby the mixer can convert the received signals of the plural receiving channels into the signal of a certain intermediate frequency.

In RAM 44 is produced a register setting table 44a, in which data is to be registered in the automatic tuning process as will be described later. In the register setting table 44a are registered plural pieces of bit data of the switching register 42 each indicating a tuning point of the tuning circuit 20 corresponding to a frequency of the desired wave.

Relationship between a frequency of the desired wave, a local frequency of the local oscillation signal and an image frequency will be described. The image frequency is an interference frequency other than the desired frequency received by receivers of the super-heterodyne type.

FIG. 3 is a view showing a table for explaining a relationship between the frequencies of the desired signals and image frequencies.

Figure 4:
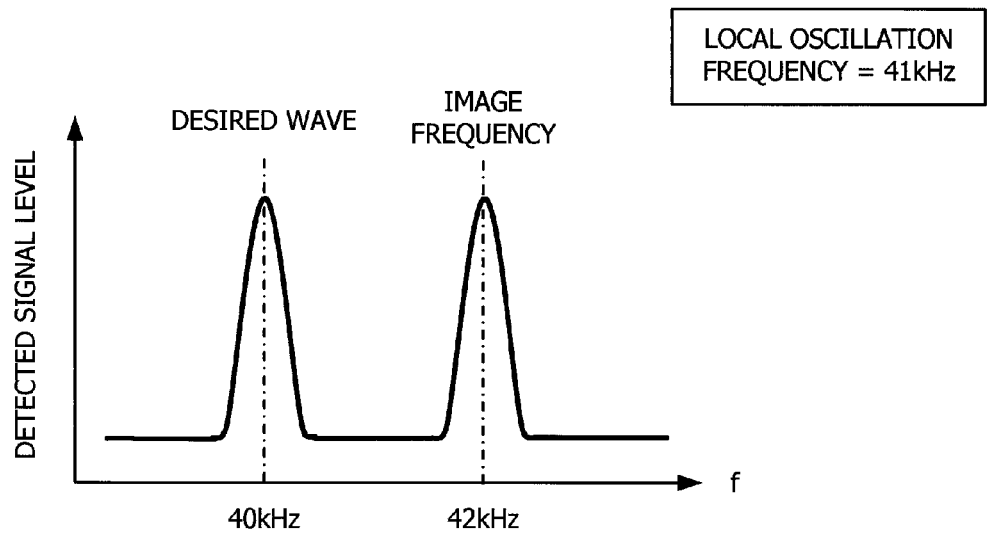
FIG. 4 is a graph showing a relationship between a received frequency "f" and a signal level of a detected signal in case of "Upper Local".
Figure 5:
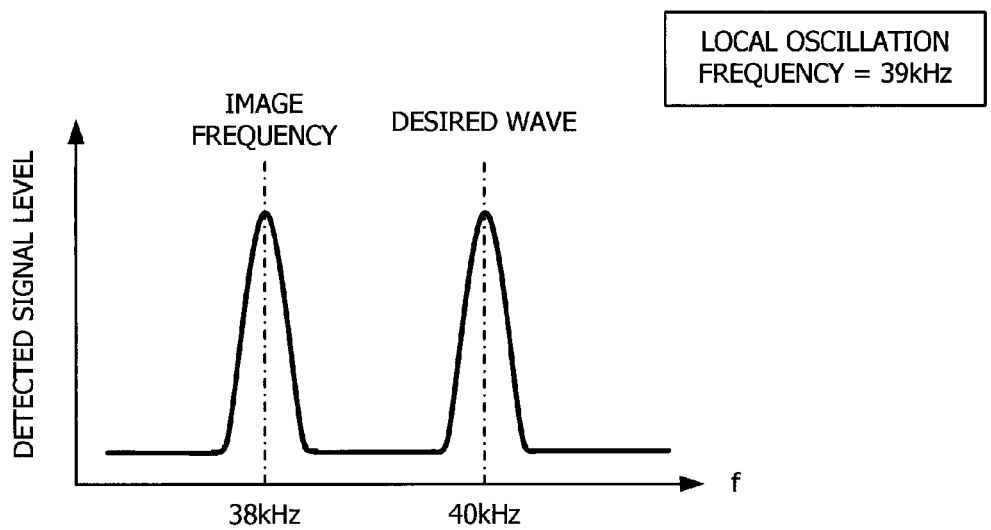
FIG. 5 is a graph showing a relationship between a received frequency "f" and a signal level of the detected signal in case of "Lower Local".

FIG. 4 is a graph showing a relationship between a received frequency "f" and a signal level of a detected signal in case of "Upper Local". FIG. 5 is a graph showing a relationship between a received frequency "f" and a signal level of the received signal in case of "Lower Local".

For example, in the case that the local oscillation frequency of the local oscillator 33 is set to 41 kHz ("Upper Local") to receive a desired wave of 40 kHz, converting the same into an intermediate frequency of 1 kHz, since the mixer 32 converts the desired signal of 40 kHz and a signal of an image frequency of 42 kHz into a signal of an intermediate frequency of 1 kHz, the signal having the image frequency of 42 kHz appears at an output of the band pass filter 34 in addition to the desired wave of 40 kHz as shown in FIG. 4.

Meanwhile, in the case that the local oscillation frequency of the local oscillator 33 is set to 39 kHz ("Lower Local") to receive the desired wave of 40 kHz, converting the same into an intermediate frequency of 1 kHz, since the mixer 32 converts the desired wave of 40 kHz and a signal having an image frequency of 38 kHz into the signal of an intermediate frequency of 1 kHz, a signal having an image frequency of 38 kHz appears at the output of the band pass filter 34 in addition to the desired wave of 40 kHz as shown in FIG. 5.

Therefore, as shown in the table of FIG. 3, the relationship between the frequency of the desired wave and the image frequency of the desired wave can be determined primarily from the relationship between the frequency of the desired wave and the local oscillation frequency of the local oscillator. In the case of "Upper Local", the frequency of the desired wave is lower than the image frequency and in the case of "Lower Local", the frequency of the desired wave is higher than the image frequency.

Now, the automatic tuning process performed in the radio wave receiving apparatus 1 will be described.

Figure 6:
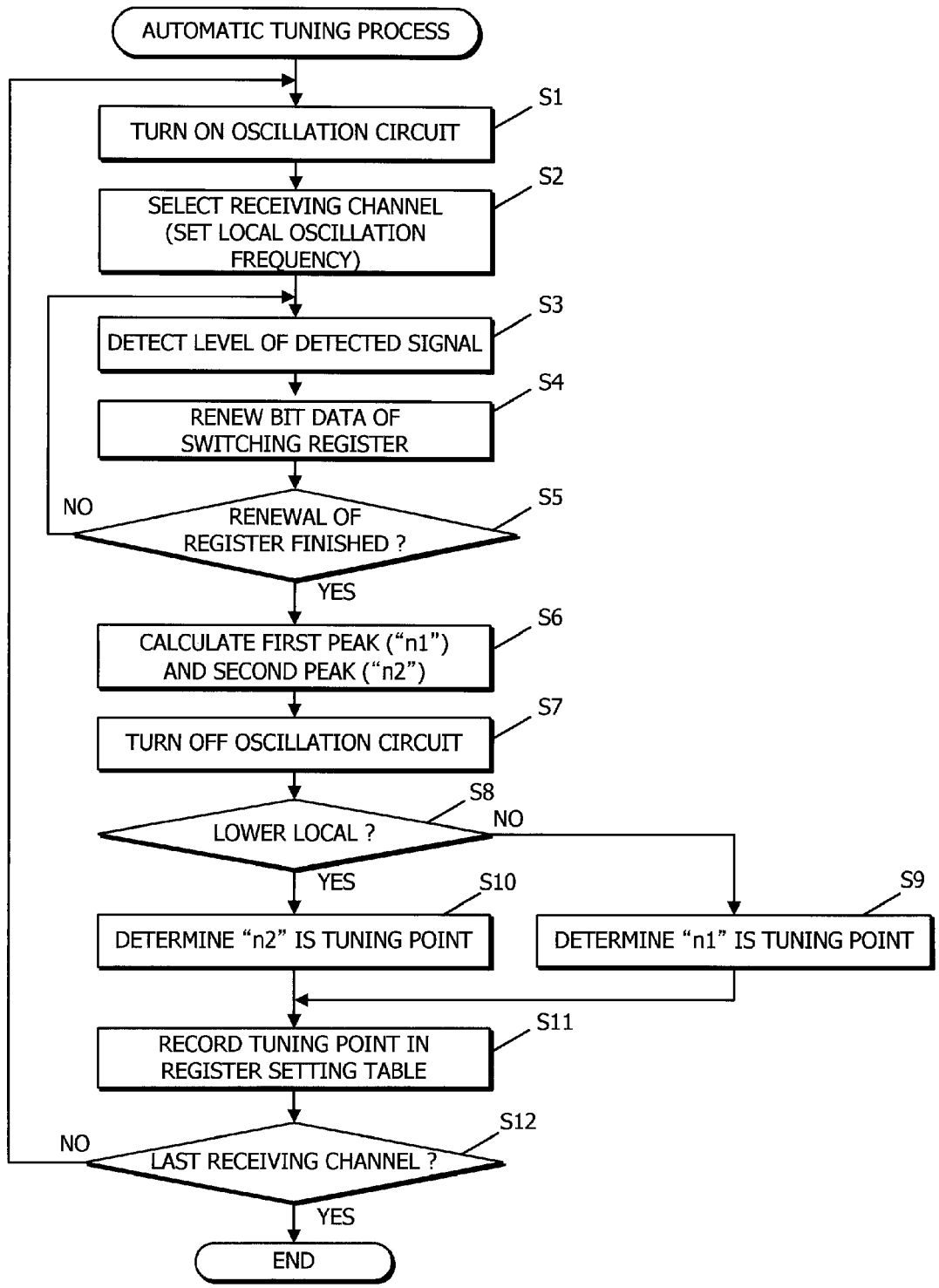
FIG. 6 is a flow chart of an automatic tuning process to be performed by CPU of FIG. 1.
Figure 7:
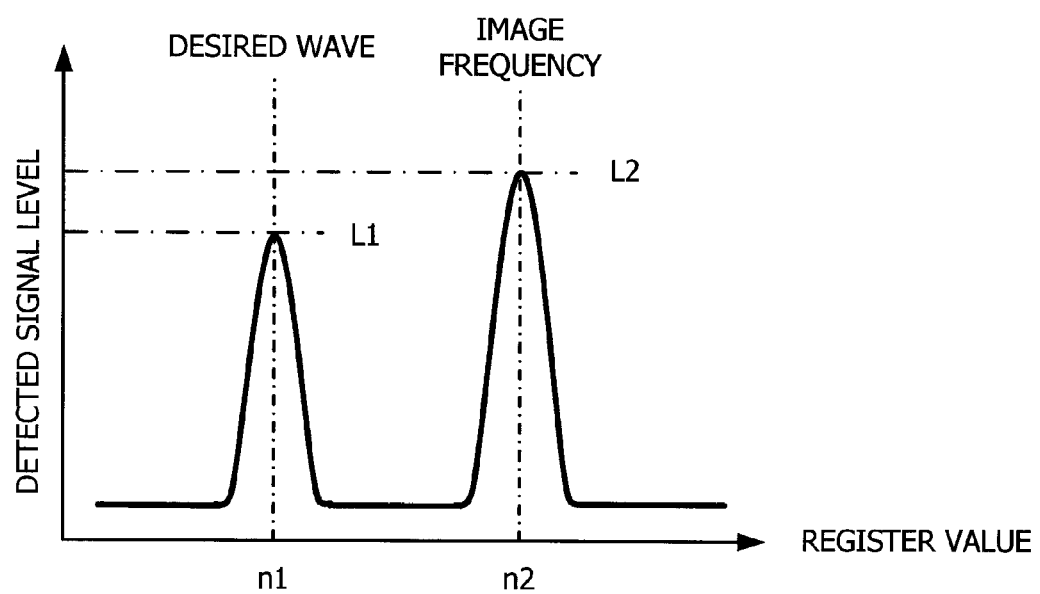
FIG. 7 is a view showing an example of a signal level of a detected signal in the automatic tuning process.

FIG. 6 is a flow chart of the automatic tuning process to be performed by CPU 40. FIG. 7 is a graph showing an example of an output level of a detected signal in the automatic tuning process.

The automatic tuning process is performed during a setting process of the radio wave receiving apparatus 1, whereby the tuning point of the tuning circuit 20 is obtained, where the receiving frequency of the antenna 10 is tuned in to the frequency of the desired wave.

In the automatic tuning process, CPU 40 turns on the switch SW1 at step S1 to make the non-inverting amplifier 39 operate. Then, an output of RF amplifier 31 is positively feed back to the signal line of the tuning circuit 20 through the non-inverting amplifier 39 and coupling condenser Cf, wherein a loop circuit including RF amplifier 31, the tuning circuit 20, the non-inverting amplifier 39, and coupling. condenser Cf cooperate to compose an oscillation circuit. This oscillation circuit performs an oscillation operation. An inductance element of the antenna 10 and a capacitance element of the tuning circuit 20 have a large effect on a loop delay of the oscillation circuit but a signal delay due to the non-inverting amplifier 39 and coupling condenser Cf is in a level discounted. Therefore, the oscillation frequency of the oscillation circuit is substantially the same as the tuning frequency of the tuning circuit 20 and the antenna 10. CPU 40 selects one receiving channel from the receiving channels in the channel setting information 43a one by one at step S2. Selecting one receiving channel at step S2, CPU 40 sends the channel switching signal to the local oscillator 33, whereby the local oscillator 33 generates a local oscillation signal of a local oscillation frequency corresponding to the selected receiving channel.

Since the oscillation signal of the same frequency as the tuning frequency is output from RF amplifier 31, the RF amplifier 31 supplies the oscillation signal to the mixer 32, and the mixer 32 mixes the oscillation signal with the local oscillation signal from the local oscillator 33, generating a frequency converted signal. The frequency converted signal is supplied to the band pass filter 34. The band pass filter 34 allows only signals (for example, 1 kHz) falling within a certain intermediate frequency band to pass through, and therefore the frequency converted signal does not fall within such an intermediate frequency band, no signal is allowed to pass through the band pass filter 34 and supplied to the detector 36. Meanwhile, the frequency converted signal that falls within such an intermediate frequency band is allowed to pass through the band pass filter 34 and supplied to the detector 36.

In this state, CPU 40 detects a level of a detected signal of AD converter 41, and associates the detected level of the detected signal with the bit data registered in the switching register 42 to record therein at step S3. Then, the bit data of the switching register 42 is renewed and the frequency characteristic of the tuning circuit 20 is switched at step S4. CPU 40 judges at step S5 whether or not the renewal of the switching register 42 has been finished. When the renewal of the switching register 42 has not yet been finished (NO at step 5), CPU 40 returns to step S3, repeatedly performing processes at steps S3 to S5 until the renewal of the switching register 42 finishes.

The bit data of the switching register 42 is switched with respect to all the patterns in the processes performed at steps S3 to S5, whereby all the tuning frequencies of the tuning circuit 20 are switched from low to high frequencies at fine intervals, and levels of the detected signal are successively detected at all the tuning frequencies of the tuning circuit 20.

When the tuning frequency of the tuning circuit 20 has become equal to the frequency of the desired wave, the oscillation signal having the same frequency as the tuning frequency is supplied to the mixer 32, whereby a signal having a frequency falling within a certain intermediate frequency band is generated. The signal having such a frequency passes through the band pass filter 34, and a detected signal of a high level appears at an output terminal of the detector 36.

Meanwhile, when the tuning frequency of the tuning circuit 20 has become equal to the image frequency of the desired wave, the oscillation signal having the same frequency as the image frequency is supplied to the mixer 32, whereby a signal having a frequency falling within the certain intermediate frequency band is generated. The signal having such a frequency passes through the band pass filter 34, and the detected signal of a high level appears at the output terminal of the detector 36. When the tuning frequency of the tuning circuit 20 is set to a frequency other than the frequency or the image frequency of the desired wave, the oscillation signal having such frequency is supplied to the mixer 32, whereby a signal having a frequency falling in other frequency band is generated. This signal is reduced in the band pass filter 34, and the detected signal of a low level appears at the output terminal of the detector 36.

When the data obtained in the processes at steps S3 to S5 is illustrated in a graph with a horizontal axis indicating a value (tuning frequency) of the switching register 42 and a vertical axis indicating a signal level of the detected signal, it will be found that the detected signal has two peaks L1 and L2 as shown in FIG. 7. These peaks L1, L2 appear at the time when the tuning frequency of the tuning circuit 20 meets with the frequency of the desired wave and at the time when the tuning frequency of the tuning circuit 20 meets with the image frequency of the desired wave.

It is hard to tell whether the peak L1 corresponds to the frequency of the desired wave or corresponds to the image frequency, even though these peaks L1 and L2 are compared with each other, because the peak L1 corresponding to the frequency of the desired wave can be lower than the leak L2 corresponding to the image frequency of the desired wave. Meanwhile, the relationship between the frequency of the desired wave and the image frequency can be determined depending on "Upper Local" and/or Lower Local" (relationship between the frequency of the desired wave and the local oscillation frequency) as shown in FIG. 3, and therefore the peak corresponding to the desired wave can be determined. In the automatic tuning process, the tuning point corresponding to the desired wave can be selected.

At step S6, CPU 40 calculates from the data obtained in the processes at step S3 to S5 a register value "n1" of the switching register 42, at which the first peak of the detected signal appears, and a register value "n2" of the switching register 42, at which the second peak of the detected signal appears. Then, CPU 40 advances to step S7, turning off the switch SW1 to keep the non-inverting amplifier 39 and the oscillation circuit out of operation at step S7.

CPU 40 reads the local oscillation frequency high-low information of the currently selected receiving channel included in the channel setting information 43*a* to determine whether "Upper Local" is true or "Lower Local" is true at step S8. In other words, CPU 40 determines at step S8 whether the local oscillation frequency of the local oscillator 33 is higher than the frequency of the desired wave ("Upper Local") or the frequency of the desired wave is higher than the local oscillation frequency of the local oscillator 33 ("Lower Local"). In the case of "Upper Local", CPU 40 determines at step S9 that the register value "n1" of a lower frequency among the two register values "n1" and "n2" calculated at step S6 is the tuning point corresponding to the desired wave. Meanwhile, in the case of "Lower Local", CPU 40 determines at step S10 that the register value "n2" of a higher frequency among the two register values "n1" and "n2" calculated at step S6 is the tuning point corresponding to the desired wave.

Determining the tuning point, CPU 40 records in the register setting table 44*a* the register value determined as the tuning point in association with the receiving channel at step 511.

Then, CPU 40 judges at step S12 whether the receiving channel in the tuning process is the last channel or not. When it is not determined that the receiving channel in the tuning process is the last channel (NO at step S12), CPU 40 returns to step S1, performing the tuning process with respect to the next receiving channel. And the processes at steps S1 to S11 are repeatedly performed with respect to all the receiving channels, whereby the tuning point of the tuning circuit 20 corresponding to the desired wave in each receiving channel is obtained, and the register value of the switching register 42 determined as the tuning point is recorded in the register setting table 44*a*. When the tuning point of the tuning circuit 20 has been obtained with respect to all the receiving channels, the automatic tuning process finishes.

When the radio wave receiving apparatus 1 receives a radio wave of a receiving channel, CPU 40 reads a register value corresponding to the receiving channel from the register setting table 44*a*, and registers the register value to the switching register 42. Further, CPU 40 reads the local oscillation frequency setting information corresponding to the receiving channel from the channel setting information 43*a* and switches the oscillation frequency of the local oscillator 33 to the frequency corresponding to the local oscillation frequency setting information. Since the operation of the oscillation circuit is not required, the switch SW1 is kept turned off.

The above arrangement brings the tuning circuit 20 tuned in to the frequency of the receiving channel, and makes the local oscillator 33 generate a local oscillation signal of a frequency corresponding to the receiving channel, whereby the standard radio wave of the receiving channel can be received at a high sensitivity to demodulate the time code.

In the radio wave receiving apparatus 1 according to the embodiment of the invention, ON-OFF operation of the switch SW 1 makes the loop circuit including the tuning circuit 20 perform an oscillation operation, allowing the tuning circuit 20 to automatically adjust the tuning frequency. Further, depending on "Upper Local" information (the frequency of the desired wave is lower than the local oscillation frequency) or "Lower Local" information (the frequency of the desired wave is higher than the local oscillation frequency) it is determined whether the tuning point of the tuning circuit 20 has met the frequency of the desired wave or the image frequency, and therefore effect of the image frequency is reduced and the tuning point of the tuning circuit corresponding to the frequency of the desired wave can be obtained without failure.

The radio wave receiving apparatus 1 according to the embodiment of the invention has the channel setting information 43*a*, in which the local oscillation frequency and local oscillation frequency high-low information with respect to each receiving channel are recorded. Tn the radio wave receiving apparatus 1, it is judged depending on the local oscillation frequency high-low information in the channel setting information 43*a*, whether the local oscillation frequency of the local oscillator 33 is higher than the frequency of the desired wave ("Upper Local") or lower than the frequency of the desired wave ("Lower Local") with respect to each receiving channel. Therefore, even if the local oscillation frequency of the local oscillator 33 is higher than the frequency of the desired wave ("Upper Local") in some receiving channel and in other receiving channel the local oscillation frequency of the local oscillator 33 is lower than the frequency of the desired wave ("Lower Local"), the tuning point of the tuning circuit 20 which meets with the frequency of the receiving channel can be obtained without failure.

In the radio wave receiving apparatus 1 according to the embodiment of the invention, the tuning point of the tuning circuit 20 is obtained based on the signal level of the detected signal passing through the band pass filter 34 and detected by the detector 36. Therefore, the most suitable tuning point of the tuning circuit 20 is obtained, at which a signal of a high level can be received in the receiving process. Since the band pass filter 34 and detector 36, which are used in the receiving process, are also used for the purpose of detecting the level of the signal in the intermediate frequency signal band, the number of circuit elements is reduced and therefore the circuit configuration is simplified.

The invention is not limited to the particular embodiments described herein, but various rearrangements, modifications, and substitutions may be made without departing from the scope of the invention.

In the above embodiments, it is determined based on the channel setting information 43*a* whether the local oscillation frequency of the local oscillator 33 is higher than the frequency of the desired wave ("Upper Local") or lower than the frequency of the desired wave ("Lower Local"), but if it is set with respect to all the receiving channels that the local oscillation frequency of the local oscillator 33 is higher than the frequency of the desired wave ("Upper Local") , or that the local oscillation frequency of the local oscillator 33 is lower than the frequency of the desired wave ("Lower Local") , then the information of "Upper Local" and/or "Lower Local" is not required.

In the embodiment of the invention, the exemplary configuration of the tuning circuit 20 is illustrated, in which the tuning capacitors C1 to Cn are connected in parallel or disconnected by the plural switches M1 to Mn. But other elements such as a variable capacitor and an inductance may be used in place of the above tuning capacitors C1 to Cn, as far as they can be connected to the antenna 10 to change the tuning frequency of the antenna 10. The setting of the tuning circuit 20 is switched depending on the data of the switching register 42, but the setting of the tuning circuit 20 may be switched in other way.

In the embodiment of the invention, the signal level of the detected signal is detected to obtain the tuning point of the tuning circuit 20 which meets with the frequency of the desired wave and the image frequency, but the tuning point of the tuning circuit 20 may be obtained from the level of the signal which has passed through the band pass filter 34, even if such signal has not yet been supplied to the detector.

In the description of the invention, the radio wave receiving apparatus for receiving the standard radio wave including the time code has been described, the radio wave to be received is not limited to the one including the time code. The specific structure of the antenna, the frequency of the desired wave, the particular intermediate frequency, the detailed process of the automatic tuning process have been illustrated in the accompanying drawings and described in the foregoing detailed description, but it will be understood that the invention is not limited to the particular embodiments described herein, but is capable of numerous modifications and substitutions without departing from the scope of the invention.

What is claimed is:

1. A radio wave receiving apparatus comprising:
an antenna for receiving a radio wave;
a tuning unit for bringing a receiving frequency of the antenna tuned in to a frequency of a desired wave to receive a signal through the antenna;
a local oscillator for generating a local oscillation signal of a predetermined frequency;
a frequency converting unit for mixing the local oscillation signal generated by the local oscillator with the signal received through the antenna, thereby converting the received signal into an intermediate frequency signal;
a feed back unit forming an oscillation loop with a signal pass including at least a portion of the tuning unit for feeding back the received signal which has not yet been converted into the intermediate frequency signal;
a switching unit for bringing the feed back unit in operation and out of operation; and
a control unit for detecting a level of the intermediate frequency signal converted by the frequency converting unit to change a frequency characteristic of the tuning unit, thereby obtaining a tuning point corresponding to the desired wave;
wherein the control unit makes the switching unit bring the feed back unit in operation, thereby changing the frequency characteristic of the tuning unit, and when two peaks of a level of the received signal are detected while the frequency characteristic of the tuning unit is changed, the control unit selects as a tuning point corresponding to the desired wave a tuning point at which one of the two peaks of the level of the received signal is detected, corresponding to a high-low relationship between the predetermined frequency of the local oscillation signal and the frequency of the desired wave; and
wherein, when the frequency of the local oscillation signal generated by the local oscillator is set lower than the frequency of the desired wave, the control unit selects as the tuning point corresponding to the desired wave the tuning point having a higher frequency from among the two tuning points where the peaks of the level of the received signal are detected, respectively, and when the frequency of the local oscillation signal generated by the local oscillator is set higher than the frequency of the desired wave, the control unit selects as the tuning point corresponding to the desired wave the tuning point having a lower frequency from among the two tuning points where the peaks of the level of the received signal are detected, respectively.

2. The radio wave receiving apparatus according to claim 1, further comprising:
a recording unit for storing plural pieces of local oscillation frequency setting information for selectively switching a frequency of the local oscillation signal to be generated by the local oscillator from among plural frequencies in association with plural receiving channels, and plural pieces of local oscillation frequency high-low information each indicating a high-low relationship between the frequency of the desired wave and the frequency of the local oscillation signal with respect to each receiving channel,
wherein the control unit selects one of the two tuning points where the peaks of the level of the received signal are detected, based on the local oscillation frequency high-low information recorded in the recording unit.

3. The radio wave receiving apparatus according to claim 1, further comprising:
a filtering unit provided at an output side of the frequency converting unit for allowing the intermediate frequency signal to pass through; and
a demodulating unit for demodulating the intermediate frequency signal passing through the filtering unit to obtain a signal level of a signal wave,
wherein the control unit obtains a tuning point corresponding to the desired wave based on the signal level of the signal wave obtained by the demodulating unit.

4. A radio wave receiving apparatus comprising:
an antenna for receiving a radio wave;
a tuning unit for bringing a receiving frequency of the antenna tuned in to a frequency of a desired wave to receive a signal through the antenna;
a local oscillator for generating a local oscillation signal of a predetermined frequency;
a frequency converting unit for mixing the local oscillation signal generated by the local oscillator with the signal received through the antenna, thereby converting the received signal into an intermediate frequency signal;
a feed back unit forming an oscillation loop with a signal pass including at least a portion of the tuning unit for feeding back the received signal which has not yet been converted into the intermediate frequency signal;
a switching unit for bringing the feed back unit in operation and out of operation; and
a control unit for detecting a level of the intermediate frequency signal converted by the frequency converting unit to change a frequency characteristic of the tuning unit, thereby obtaining a tuning point corresponding to the desired wave;
wherein the control unit makes the switching unit bring the feed back unit in operation, thereby changing the frequency characteristic of the tuning unit, and when two peaks of a level of the received signal are detected while the frequency characteristic of the tuning unit is changed, the control unit selects as a tuning point corresponding to the desired wave a tuning point at which one of the two peaks of the level of the received signal is detected, corresponding to a high-low relationship between the predetermined frequency of the local oscillation signal and the frequency of the desired wave;
wherein the radio wave receiving apparatus further comprises a recording unit for storing plural pieces of local oscillation frequency setting information for selectively switching a frequency of the local oscillation signal to be generated by the local oscillator from among plural frequencies in association with plural receiving channels, and plural pieces of local oscillation frequency high-low information each indicating a high-low relationship between the frequency of the desired wave and the frequency of the local oscillation signal with respect to each receiving channel; and
wherein the control unit selects one of the two tuning points where the peaks of the level of the received signal are detected, based on the local oscillation frequency high-low information recorded in the recording unit.

* * * * *